United States Patent
Schoenfeld et al.

(10) Patent No.: US 6,600,215 B1
(45) Date of Patent: Jul. 29, 2003

(54) METHOD AND APPARATUS FOR COUPLING A SEMICONDUCTOR DIE TO DIE TERMINALS

(75) Inventors: Aaron Schoenfeld, Boise, ID (US); Manny K. F. Ma, Boise, ID (US); Larry D. Kinsman, Boise, ID (US); J. Mike Brooks, Caldwell, ID (US); Timothy J. Allen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/054,275

(22) Filed: Apr. 2, 1998

(51) Int. Cl.[7] .............................................. H01L 23/48
(52) U.S. Cl. ........................ 257/666; 257/690; 257/692
(58) Field of Search ................................. 257/666, 686, 257/688, 696, 689, 700, 703, 678, 690, 692

(56) References Cited

U.S. PATENT DOCUMENTS

| | | | |
|---|---|---|---|
| 4,176,443 A | 12/1979 | Iannuzzi et al. ............... 29/589 |
| 4,486,945 A | 12/1984 | Aigoo .......................... 29/588 |
| 4,685,998 A | 8/1987 | Quinn et al. ................. 156/633 |
| 4,733,289 A | 3/1988 | Tsurumaru .................... 357/54 |
| 4,750,666 A | 6/1988 | Neugebauer et al. ........ 228/160 |
| 4,821,148 A | 4/1989 | Kobayashi et al. .......... 361/392 |
| 4,866,504 A | 9/1989 | Landis .......................... 357/68 |
| 5,058,798 A | 10/1991 | Yamazaki et al. ........... 228/110 |
| 5,072,280 A * | 12/1991 | Matsukura .................... 357/70 |
| 5,101,263 A | 3/1992 | Kitano et al. ................. 357/72 |
| 5,132,772 A | 7/1992 | Fetty ............................. 357/68 |
| 5,182,631 A * | 1/1993 | Tominuro et al. ............ 257/664 |
| 5,235,212 A | 8/1993 | Shimizu et al. .............. 257/780 |
| 5,298,793 A | 3/1994 | Kotani et al. ................. 257/765 |
| 5,328,079 A | 7/1994 | Mathew et al. ........... 228/180.5 |
| 5,343,064 A | 8/1994 | Spangler et al. ............. 257/350 |
| 5,371,654 A | 12/1994 | Beaman et al. .............. 361/744 |
| 5,400,950 A * | 3/1995 | Myers .......................... 257/778 |
| 5,455,195 A | 10/1995 | Ramsey et al. .............. 437/183 |
| 5,492,863 A | 2/1996 | Higgins, III ................. 437/183 |
| 5,508,232 A | 4/1996 | Ueda et al. ................... 437/211 |
| 5,539,251 A | 7/1996 | Iverson et al. ............... 257/670 |
| 5,541,446 A | 7/1996 | Kierse .......................... 257/666 |
| 5,550,083 A | 8/1996 | Koide et al. ................. 437/183 |
| 5,559,054 A | 9/1996 | Adamjee ...................... 437/183 |
| 5,656,830 A | 8/1997 | Zechman ..................... 257/784 |
| 5,740,956 A | 4/1998 | Seo et al. ............... 228/180.22 |
| 5,764,486 A | 6/1998 | Pendse ......................... 361/774 |
| 5,869,898 A * | 2/1999 | Sato ............................. 257/728 |
| 5,976,964 A | 11/1999 | Ball ............................. 438/613 |
| 6,277,673 B1 | 8/2001 | Corisis ......................... 438/123 |

* cited by examiner

*Primary Examiner*—Roy Potter
(74) *Attorney, Agent, or Firm*—Dorsey & Whitney LLP

(57) ABSTRACT

A method and apparatus for coupling a semiconductor die to terminals of a die package in which the die is housed. The apparatus comprises a die having first and second terminals. A first conductive member is elongated between a first end portion and a second end portion thereof such that the second end portion is proximate to the first terminal. A second conductive member is elongated between a first end portion and second end portion thereof such that the second end portion of the second conductive member is proximate to the second terminal of the die and the second conductive member is generally parallel to the first conductive member. The second end portions of the first and second conductive members may be coupled with conductive couplers to the first and second die terminals, respectively. The conductive members and conductive couplers may be sized and shaped to produce a selected capacitance and/or a selected impedance at the die terminals. The first and second conductive members may each have an intermediate portion between the first and second end portions thereof that is narrower than the second end portions thereof, and the conductive members may be staggered by axially offsetting the second end portion of the second conductive member from the second end portion of the first conductive member.

76 Claims, 8 Drawing Sheets

METHOD AND APPARATUS FOR COUPLING A SEMICONDUCTOR DIE TO DIE TERMINALS

TECHNICAL FIELD

The present invention is directed toward a method and apparatus for coupling a semiconductor die to die terminals.

BACKGROUND OF THE INVENTION

Semiconductor dies are typically encased in a plastic shell or package prior to installation in microelectronic devices. The plastic package makes the die easier to handle during installation and protects the die from dust, dirt and other contaminants after it has been installed. The package includes package terminals, such as pins or other similar devices which have one end coupled to the bond pads of the die and an opposite end accessible outside the package. The ends of the package terminals accessible outside the package may be coupled to other microelectronic components, linking the die to those components.

FIG. 1 is a top isometric view of a representative conventional die package 10. FIG. 2 is a partially broken top plan view of the conventional die package 10 shown in FIG. 1. Referring to FIGS. 1 and 2, the die package 10 comprises a plastic body 12 housing a die 20 therein. For purposes of clarity, the top portion of the body 12 is shown in phantom lines in FIG. 1 and partially broken away in FIG. 2. The die 20 includes bond pads 21 that are coupled to circuitry within the die. The bond pads 21 are also coupled with wire bonds 50 to leadfingers 40 that extend outwardly away from the die to the edges of the die package 10 where they are coupled to pins 30. The pins 30 project outwardly beyond the edges of the body 12 and may be coupled with other electronic components in a conventional manner so that the die 20 may communicate with the other components.

One problem with the conventional die package 10 described above is that the leadfingers 40 may limit the minimum size of the die package and die 20. The ends of the leadfingers 40 must have a surface area which is large enough to permit the bond wires 50 to be easily coupled thereto. The leadfingers 40 must also be large enough to secure the die 20 in a selected position as the die is encapsulated in the body 12 during manufacture of the die package 10. The large surface area of the leadfingers 40 and the spacing between adjacent leadfingers may limit the minimum size of the die package 10. The size and spacing of the leadfingers 40 may also limit the minimum distance between the corresponding bond pads 21 to which the leadfingers are connected and may accordingly limit the minimum size of the die 20.

Another problem with the conventional die package 10 described above is that the leadfingers 40 may increase the capacitance measured at the pins 30, thereby reducing the speed with which signals may propagate between the pins 30 and the corresponding bond pads 21. The reduced signal speed may decrease the overall speed and efficiency of the die 20 and the microelectronic components with which the die is coupled.

Yet another problem with the conventional die package 10 shown in FIGS. 1 and 2 is that an impedance measured at one of the pins 30 may be different than an impedance measured at another pin 30. The impedance mismatch between pins 30 of the same die 20 probably adversely affects the relative timing of signals coupled to the die through different pins 30.

In another conventional arrangement (not shown), the die 20 may be coupled to leadfingers 40 which are positioned directly on the surface of a printed circuit board. The printed circuit board may then be coupled to other microelectronic devices or other printed circuit boards. This alternate arrangement may suffer from the same problems discussed above, including a limited minimum die size, reduced signal speed and mismatched impedances.

SUMMARY OF THE INVENTION

The present invention is directed toward a method and apparatus for coupling a semiconductor die to terminals of a die package or printed circuit board which supports the die. An apparatus in accordance with one embodiment of the invention includes a microelectronic device comprising a semiconductor die having at least one terminal. The microelectronic device further comprises a conductive member elongated between a first end portion and a second end portion. The second end portion is proximate to the terminal of the die. The conductive member has an intermediate portion between the first and second end portions that is narrower than the second end portion. In one embodiment, the second end portion is positioned adjacent the semiconductor die, and in another embodiment, the second end portion is positioned on a surface of the semiconductor die. In either embodiment, the second end portion may be coupled to the die terminal with a conductive coupler.

In another embodiment of the invention, the microelectronic device comprises a package having first and second package terminals and a semiconductor die positioned within the package and having first and second die terminals. A first conductive member is coupled at one end to the first package terminal. A first conductive coupler is coupled between the first die terminal and the first conductive member. The microelectronic device further comprises a second conductive member coupled at one end to the second package terminal.

A second conductive coupler is coupled between the second die terminal and the second conductive member. The first conductive member and first conductive coupler are selected to produce a first impedance at the first package terminal and the second conductive member and second conductive coupler are selected to produce a second impedance at the second package terminal. The first and second impedances are selected to be approximately equal.

In still another embodiment, the semiconductor die may be positioned on the surface of a printed circuit board or other substrate. The substrate may include conductive members that are offset relative to each other and the semiconductor die. The conductive members may be coupled to the die terminals with conductive couplers and may also be connected to vias in the substrate.

The present invention is also embodied in a method for positioning conductive members proximate to first and second adjacent terminals of a semiconductor die. In one embodiment, the method comprises positioning an end of a first conductive member proximate the first terminal of the die and positioning an end of a second conductive member proximate the second terminal of the die. The ends of the first and second conductive members are staggered such that the end of the second conductive member is spaced apart from the second terminal by a distance which is greater than the distance between the end of the first conductive member and the first terminal.

The present invention is also embodied in a method for selecting the impedance of a conductive path between a terminal of a semiconductor die and a terminal of a package in which the die is housed. In one embodiment, the method comprises selecting a size and material of a conductive member to have a first impedance and selecting a size and material of a conductive coupler to have a second impedance. The conductive member has first and second opposite ends and the method further comprises connecting the first end of the conductive member to the terminal of the package and connecting the conductive coupler to extend between the terminal of the die and the second end of the conductive member.

DETAILED DESCRIPTION OF THE INVENTION

The present invention is embodied in an apparatus and method for coupling terminals of a die to terminals of a die package or printed circuit board which supports the die. An aspect of the invention is that conductive members which extend between the die terminals and the package terminals may be staggered to increase the number of conductive members and die terminals that may be positioned in a given die package. A further aspect of the invention is that the conductive members may be connected to the die terminals with conductive couplers, and the size and composition of the conductive members and conductive couplers may be selected to produce a selected impedance at the package terminals. FIGS. 3–10 illustrate various embodiments of the apparatus and methods, and like reference numbers refer to like parts throughout the figures.

Figure 3:
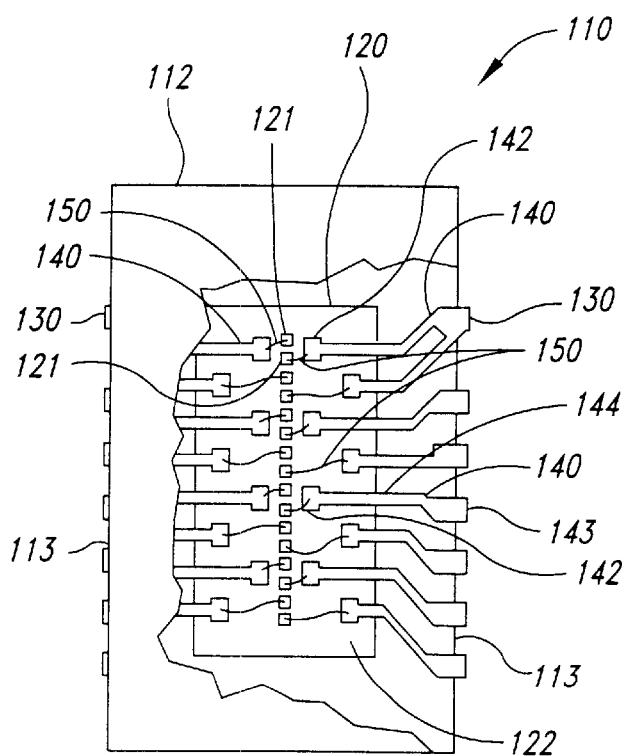
FIG. 3 is a partially broken top plan view of a die package having staggered conductive members extending over a surface of a semiconductor die in accordance with one embodiment of the invention.

FIG. 3 is a top plan view of a representative die package 110 in accordance with an embodiment of the invention. The die package 110 generally comprises a solid plastic body 112 which is shown partially broken away and which encapsulates a semiconductor chip or die 120. The die 120 has die terminals or bond pads 121 which are coupled with conductive couplers 150 and conductive members 140 to package terminals 130 positioned along the edges 113 of the body 112. The package terminals 130 project away from the body 112 so that they may be easily coupled to other microelectronic components.

The body 112 may comprise a plastic or other suitable insulating material. As shown in FIG. 3, the die 120 may be centered within the body 112 and may include die terminals 121 which are aligned along a central axis of an upper surface 122 of the die. In other embodiments, the die terminals 121 may have other configurations, as will be discussed in greater detail below with reference to FIG. 7. In one embodiment, the die terminals 121 may comprise conventional bond pads, as shown in FIG. 3, and may comprise solder balls, as will be discussed in greater detail below with reference to FIGS. 9 and 10, or other terminal devices in other embodiments.

The conductive members or leads 140 extend over the upper surface 122 of the die 120 in a "lead-over-chip" configuration so as to be proximate to the die terminals 121. The upper surface 122 of the die 120 accordingly comprises an insulating layer to electrically isolate the conductive members 140 from each other. The conductive members 140 may be adhesively bonded to the die 120 to hold the die 120 in position during manufacturing, as will be discussed in greater detail below with reference to FIG. 5.

Each conductive member 140 is elongated and has a bonding portion 142 at one end, a terminal portion 143 at an opposite end, and an intermediate portion 144 extending between the bonding portion and the terminal portion. Each bonding portion 142 is connected with a conductive coupler 150 to the corresponding die terminal 121. The conductive couplers 150 may comprise gold wire, aluminum wire, a conductive adhesive, or other suitable conductive materials which have a low resistance and may be easily bonded to the bonding portion 142 with a mechanical or chemical/mechanical bond. Each bonding portion 142 has a width sufficient to keep the bonding portion stable when the conductive coupler 150 is connected thereto. Accordingly, the bonding portion 142 may have a width of approximately 0.008 inch in one embodiment and may have other widths in other embodiments.

Figure 1:
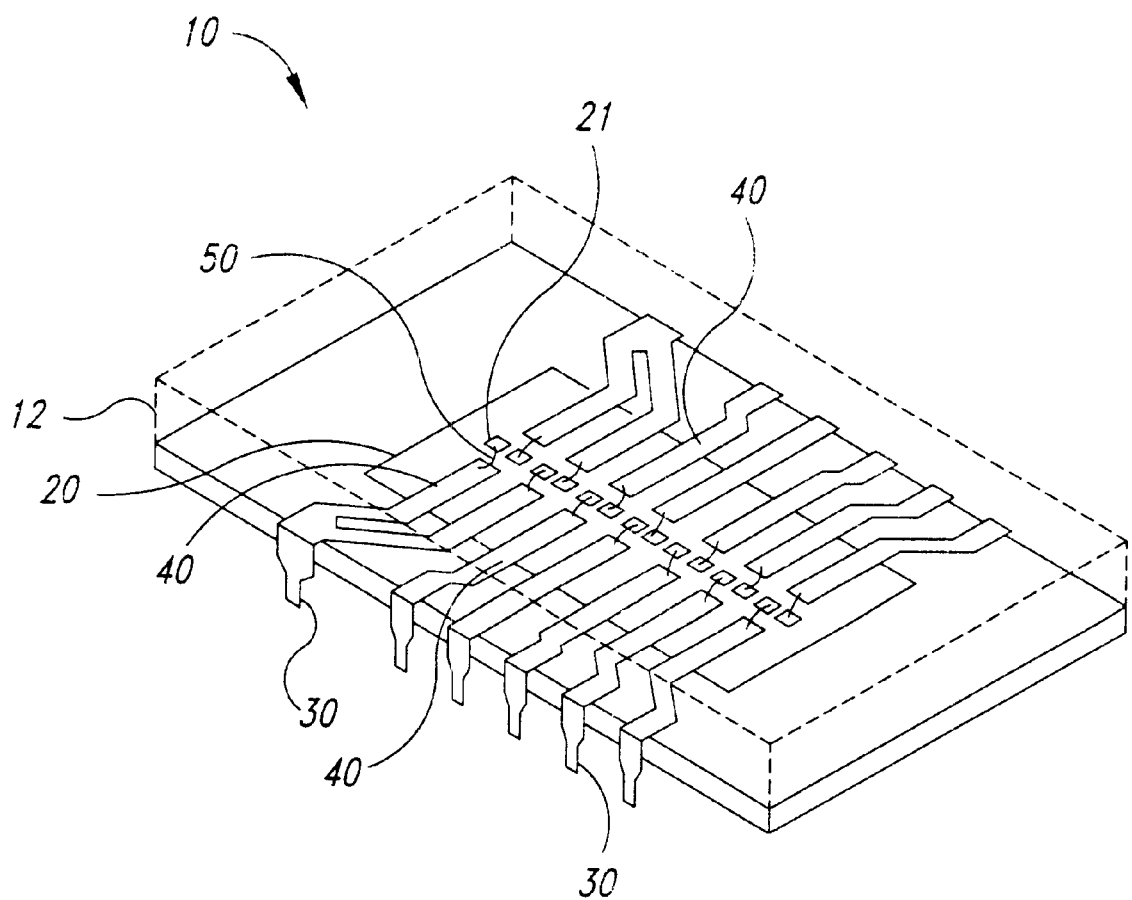
FIG. 1 is a top isometric view of a die package in accordance with the prior art.
Figure 2:
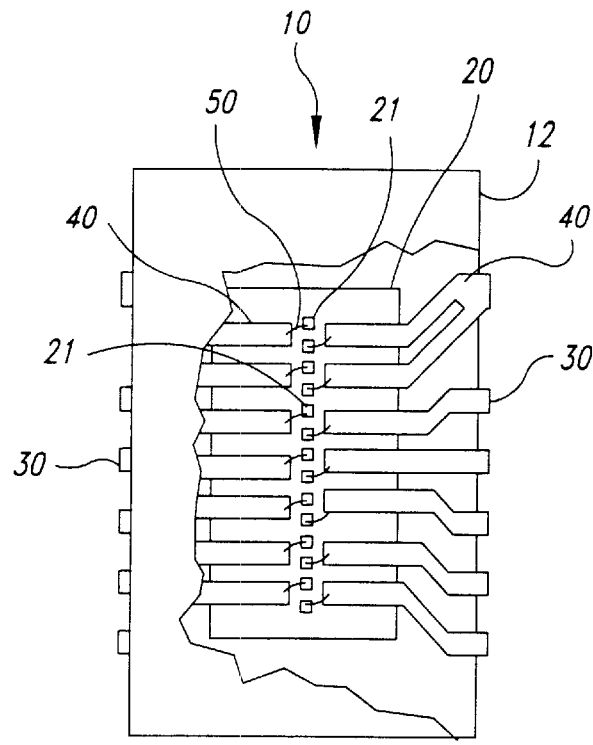
FIG. 2 is a partially broken top plan view of the die package shown in FIG. 1.

The intermediate portion 144 of each conductive member 140 has a width which is less than the width of the bonding portion 142 and less than the width of the conventional leadfingers 40 shown in FIGS. 1 and 2. Accordingly, the spacing between adjacent conductive members 140 may be reduced by positioning the bonding portion 142 of one conductive member adjacent the intermediate portion 144 of the neighboring conductive member. Each conductive member 140 may be axially offset relative to its neighbor, producing a staggered pattern of conductive members, as shown in FIG. 3.

In one embodiment, the intermediate portions 144 have a width of approximately 0.004 inch. The intermediate portions 144 may have other widths in other embodiments, so long as the intermediate portions are narrow enough to allow adjacent conductive members 140 to be staggered, as shown in FIG. 3, and wide enough to support the die 120 in position when the body 112 is formed around the die. Furthermore, if the intermediate portions 144 are too narrow, the conductive members 140 may tend to curl or otherwise bend away from the die 120, making it difficult to attach the conductive members to the die, and making it difficult to attach the conductive couplers 150 to the conductive members. Accordingly, the intermediate portions 144 may be wide enough in one embodiment to keep the conductive member 140 substantially flat against the upper surface 122 of the die 120.

The terminal portion 143 of each conductive member 140 is connected to a corresponding package terminal 130, as shown in FIG. 3. The package terminals 130 may comprise pins in one embodiment and may comprise other types of terminals or connectors in other embodiments. In one embodiment, the bonding portion 142, intermediate portion 144, and terminal portion 143 are formed integrally with each other and with the corresponding package terminal 130, as will be discussed in greater detail below with reference to FIG. 5.

One advantage of the conductive members 140 shown in FIG. 3 is that they may be spaced more closely together than conventional leadfingers. Accordingly, an increased number of conductive members 140 may be positioned on the upper surface 122 of the die 120, as may be seen by comparing the die package 110 shown in FIG. 3 with the conventional die package 10 shown in FIG. 2. The die package 110 shown in FIG. 3 has sixteen conductive members 140, while the conventional die package 10 shown in FIG. 2 has only fourteen leadfingers 40 positioned on a die 20 having the same dimensions as the die shown in FIG. 3. The die package 110 may have a greater or lesser number of conductive members 140 in alternate embodiments. The increased number of conductive members 140 may provide the connections necessary to transmit signals to and/or from an increased number of die terminals 121.

A further advantage of the conductive members 140 is that the relatively narrow intermediate portions 144 thereof reduce the overall size, and therefore capacitance, of each conductive member when compared with a conventional leafage. The conductive members 140 may accordingly transmit signals to and/or from the die terminal 121 at a faster rate than the conventional leadfingers 40 shown in FIGS. 1 and 2.

In the embodiment shown in FIG. 3, the die package 110 has an increased number of die terminals 121, conductive members 140, and package terminals 130 when compared to the conventional die package 10 shown in FIG. 2. In another embodiment shown in FIG. 4, the die package 110a may have the same number and spacing of package terminals 130 as the conventional die package 10, so as to be compatible with devices configured to be coupled to the conventional die package. The die package 110a may have an increased number of conductive members 140 and die terminals 121, as discussed above with reference to FIG. 3, so long as the additional conductive members 140 are coupled to existing package terminals 130. Accordingly, two pairs of conductive members 140a and 140b are each connected to existing package terminals 130a. The die package 110a accordingly has twelve package terminals, as does the conventional die package 10 shown in FIG. 2. The die package 110a has sixteen conductive members 140 and die terminals 121, as compared with the conventional die package 10 shown in FIGS. 1 and 2 which has only fourteen leadfingers 40 and bond pads 21.

Figure 4:
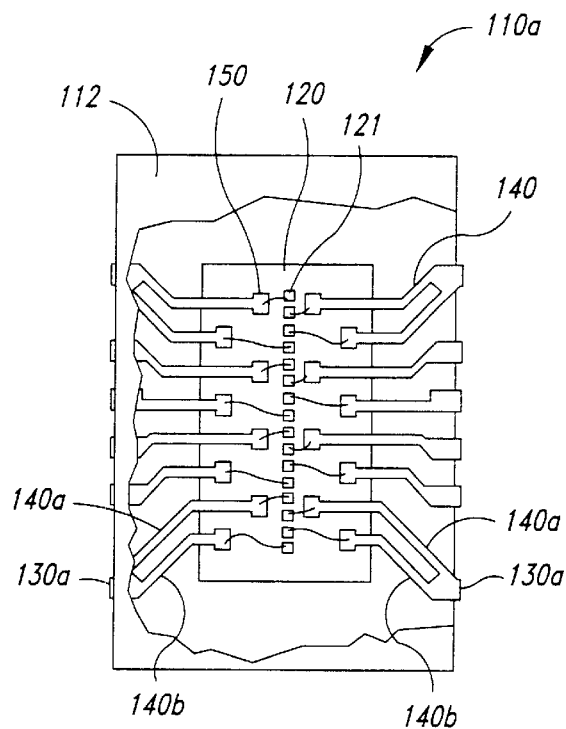
FIG. 4 is a partially broken top plan view of a die package having staggered conductive members and the same number of package terminals as shown in FIG. 1, housing a die with an increased number of die terminals, in accordance with another embodiment of the invention.

An advantage of the die package 110a shown in FIG. 4 is that it may include a die 120 having an increased number of die terminals 121 while the die package itself has the same number of package terminals 130 as a conventional package. The increased number of die terminals 121 may increase the performance of the die, as discussed above with reference to FIG. 3. Furthermore, because the die package 110a has the same number of package terminals 130 as a conventional die package, it may be easily coupled to the same devices as is a conventional die package.

Figure 5:
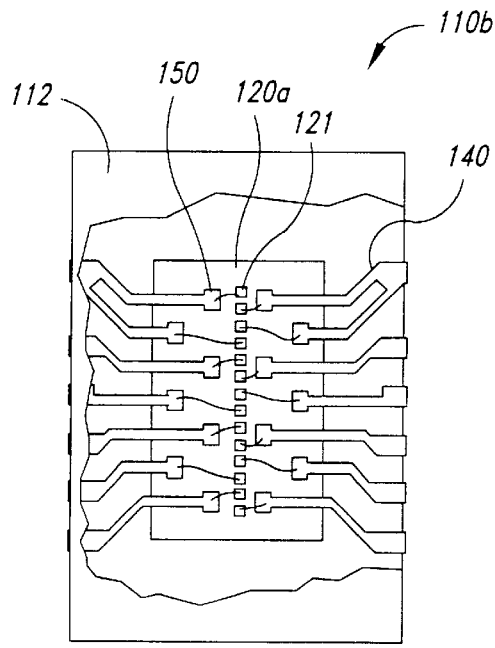
FIG. 5 is a partially broken top plan view of a die package having staggered conductive members and the same number of package terminals as shown in FIG. 1, housing a die with closely spaced die terminals in accordance with another embodiment of the invention.

FIG. 5 is a partially broken top plan view of a die package 110b housing a reduced size die 120a in accordance with another embodiment of the invention. The die 120a has the same number of die terminals 121 as does the conventional die 20 shown in FIGS. 1 and 2. The die terminals 121, however, are more closely spaced than are the bond pads 20 shown in FIG. 2. Accordingly, the overall size of the die 120a may be reduced when compared to the overall size of the die 20 shown in FIG. 2. As shown in FIG. 5, the conductive members 140 are staggered so as to remain proximate to the corresponding die terminals 121. As a result, the overall size of the die package 110b may be reduced when compared to the die package 10 shown in FIG. 2. This configuration is advantageous where it is desirable to reduce the size of the die 120a and/or the package 112 housing the die, as is the case in any number of myriad of microelectronic applications.

Figure 6:
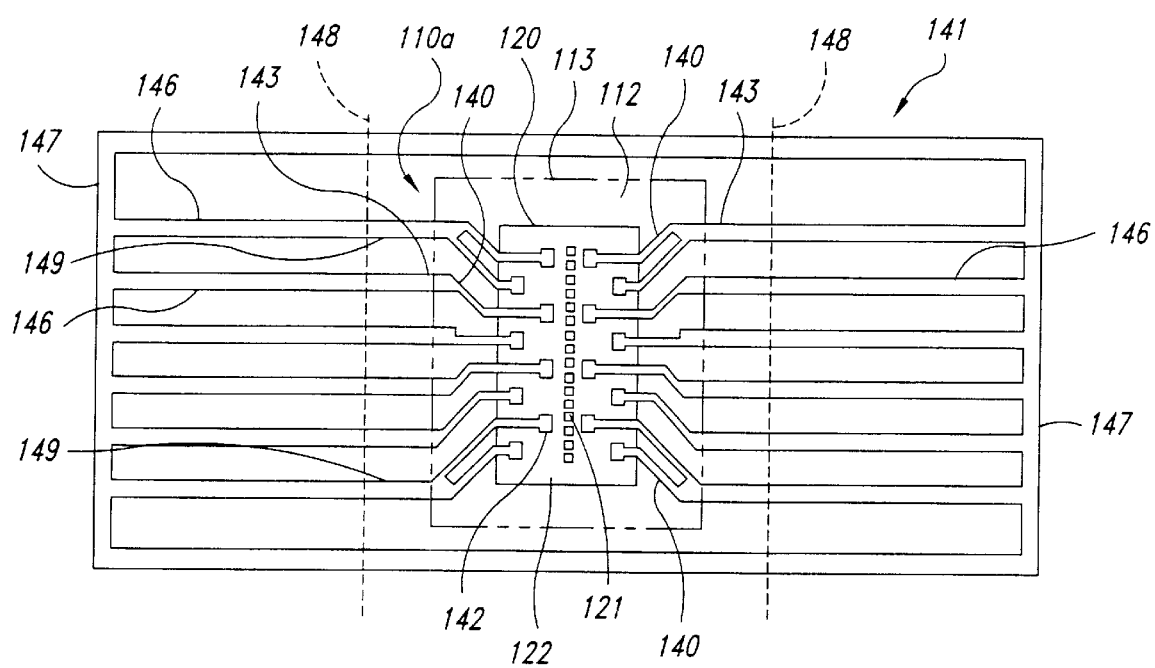
FIG. 6 is a top plan view of a lead frame for supporting the conductive members shown in FIG. 4.

FIG. 6 is a top plan view of a lead frame 141 formed during manufacture of the die package 110a discussed above with reference to FIG. 4. A similar lead frame may be formed during manufacture of the die packages 110, 110b discussed above with reference to FIGS. 3 and 6. The lead frame 141 comprises conductive members 140 substantially identical to those shown in FIG. 4, except that the conductive members each include an elongated portion 146 extending outwardly away from the terminal portions 143 thereof. The elongated portions 146 are connected with connective portions 147 so that each conductive member 140 has a fixed location relative to the other conductive members. In one embodiment, the lead frame 141 may be etched from a sheet of metallic material, such as a nickel/iron alloy, a copper alloy or another suitable conductive material. In another embodiment, the lead frame 141 may be stamped from a metallic sheet. Other manufacturing methods may be used in further embodiments.

As shown in FIG. 6, the die package 110a may be formed by attaching the lead frame 141 to the die 120 and then encapsulating the die and a portion of the lead frame in the body 112, the edges 113 of which are shown in phantom lines in FIG. 6. In one embodiment, the lead frame 141 may be attached to the die by adhesively bonding the conductive members 140 to the upper surface 122 of the die 120 such that the bonding portions 142 of the conductive members are adjacent the corresponding die terminals 141. The conductive couplings 150 (FIG. 4) may be connected between the die terminals 121 and the bonding portions 142 without substantial risk that the die will move relative to the conductive members 140 and potentially disrupt the coupling established therebetween. The lead frame 141 may then be clamped between two halves of a mold (not shown), the inner edges of which correspond to the outer edges 113 of the body 112. The mold may be filled with a liquid or flowable non-conductive encapsulating material which is then allowed to harden, forming the body 112. The body 112, die 120, and lead frame 141 may be removed as a unit from the mold and elongated portions 146 are trimmed along trim lines 148 to remove excess material. The residual tab portions 149 may be bent perpendicular to the body 112 to form the package terminals or pins 130 shown in FIGS. 3–5.

An advantage of the lead frame 141 shown in FIG. 6 is that it has a greater number of conductive members 140 than does a conventional lead frame. Accordingly, the lead frame 141 may provide additional support for the die 120 as it is encapsulated in the body 112, reducing the likelihood that the die may move relative to the lead frame and disturb the electrical connections formed therebetween.

Figure 7:
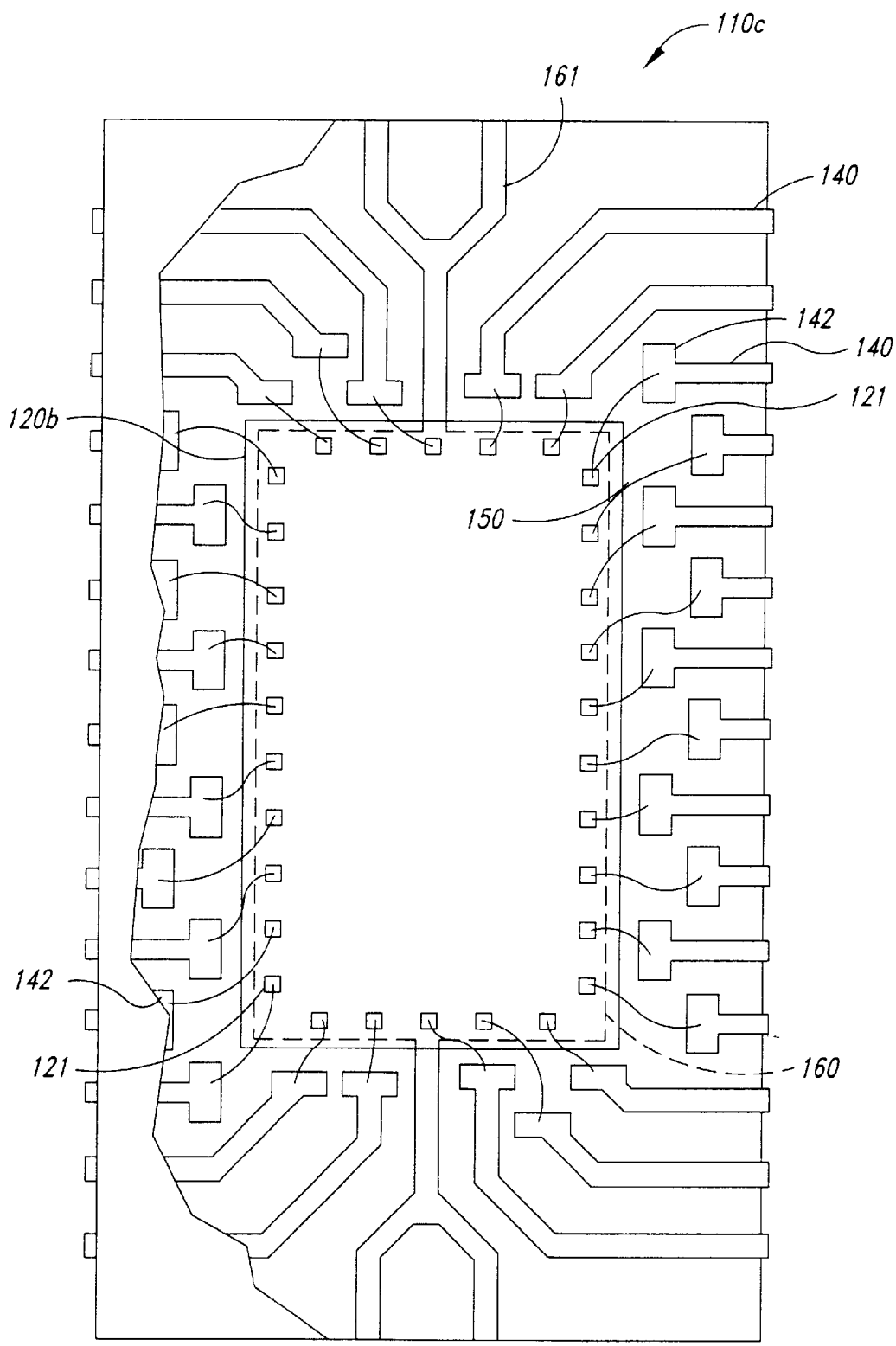
FIG. 7 is a partially broken top plan view of a die package having staggered conductive members positioned proximate a semiconductor die in accordance with another embodiment of the invention.

FIG. 7 is a top plan view of another embodiment of a die package 110c having conductive members 140 which extend up to but not over the die 120b. The die 120b has die terminals 121 spaced around the periphery thereof, proximate to the bonding portions 142 of the conductive members 140 and are bonded to the bonding portions with conductive couplings 150, substantially as discussed above with reference to FIG. 3. The conductive members 140 are sized and shaped similarly to the conductive members shown in FIG. 3, so as to create a staggered pattern of bonding portions 142. During manufacture, the conductive members 140 may be interconnected with connective portions, substantially as discussed previously with reference to FIG. 6. In addition, the connective portions may be connected to paddle fingers 161 which are in turn connected to a support paddle 160. The support paddle 160 is positioned beneath the die 120b and has the same general plan-form shape as the die. The support paddle 160 and the paddle fingers 161 support the die relative to the conductive members 140 when the conductive members are coupled to the die terminals 121 with the conductive couplings 150.

As shown in FIG. 7, the conductive members 140 may be advantageously staggered to increase the number of conductive members which may be bonded to the die 120b. As discussed previously with respect to FIG. 3, the die 120b may accordingly have more die terminals 121 than a die housed in a conventional die package. The additional conductive members 140 may be coupled to a conventional number of package terminals 130, in a manner similar to that shown in FIG. 4, or to an increased number of package terminals in a manner similar to that shown in FIG. 3. In another embodiment, the number of conductive members 140 and package terminals 130 may be the same as a conventional die package, but the die 120b and/or the die package 110b may have a reduced size when compared to their conventional counterparts, in a manner similar to that discussed above with reference to FIG. 5.

Figure 8:
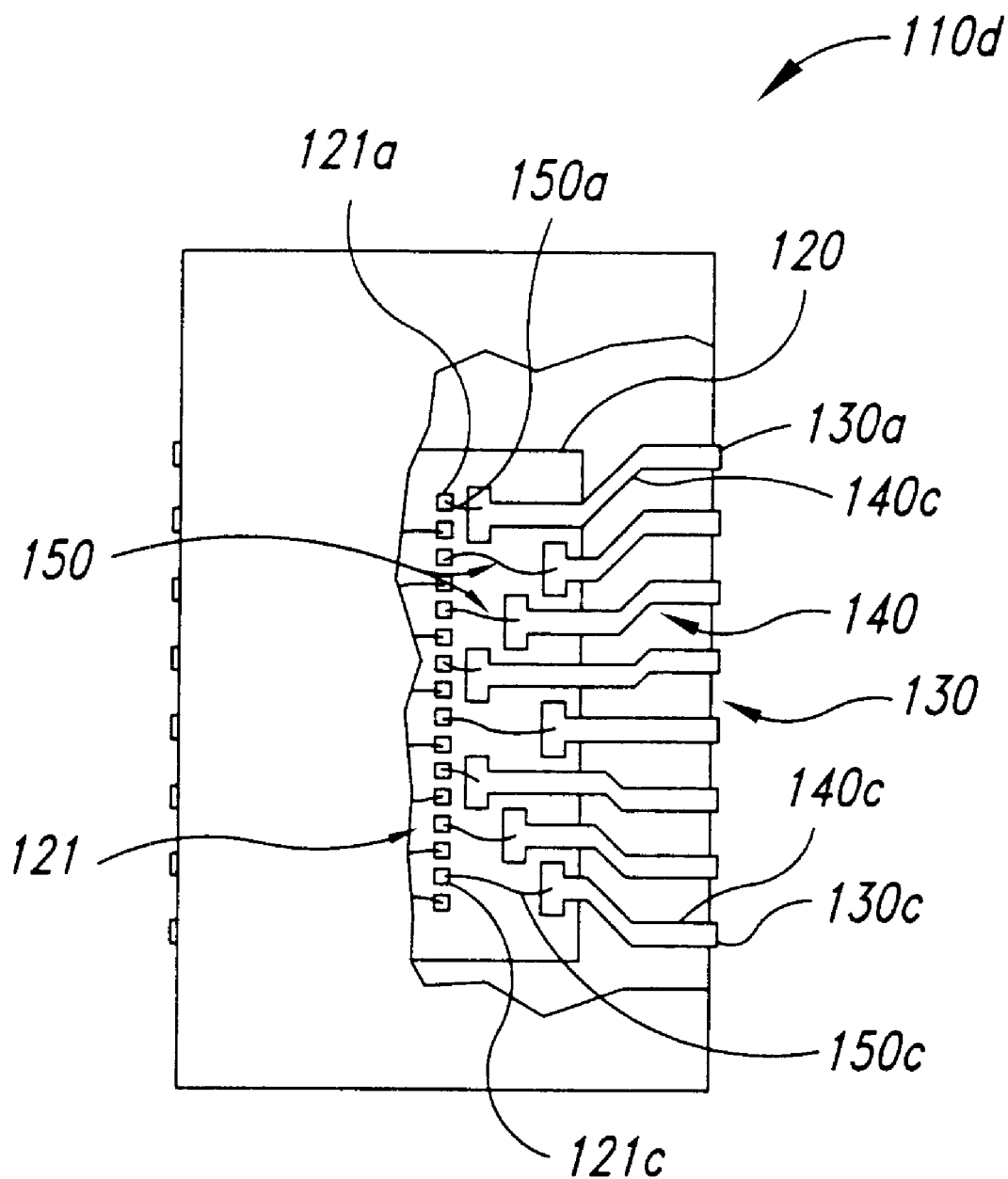
FIG. 8 is a partially broken top plan view of a die package having conductive members and conductive couplers of varying lengths in accordance with yet another embodiment of the invention.

FIG. 8 is a plan view of a die package 110d in accordance with another embodiment of the invention having conductive members 140 and conductive couplers 150 sized to have a desired capacitance and/or impedance. As discussed above with reference to FIG. 3, the conductive couplers 150 may be formed from thin wire, having a generally circular cross-sectional shape and a relatively small surface area. The capacitance between pairs of conductive couplers 150 and/or between one conductive coupler and ground is accordingly relatively low and the conductive couplers may not significantly reduce the rate at which signals propagate between the die terminals 121 and the package terminals 130. The conductive members 140 may comprise portions of thin sheets having a relatively large surface area and the capacitance between pairs of conductive members 140 and/or between one conductive member and ground may be relatively high. On the other hand, the conductive members 140 may be stronger and more rigid than the conductive couplers 150. The conductive members 140 may accordingly form a more stable connection between the die terminals 121 and the package terminals 130, and may be less likely to break during manufacture and may be less likely to flex to such a degree as to contact adjacent conductive members.

In one embodiment, the relative lengths of the conductive couplers 150 and conductive members 140 are chosen to maintain a relatively low total capacitance while at the same time maintaining a relatively high level of stability. In another embodiment, other dimensions of the conductive couplers 150 and conductive members 140, including the widths and thicknesses thereof, may be selected to reduce the capacitance between the die terminals 121 and package terminals 130 while maintaining a stable connection therebetween which adequately supports the die 120 as the die package 110d is manufactured.

The conductive couplers 150 discussed above may have a relatively higher inductance than the conductive members 140. Accordingly, in one embodiment, where it is desirable to reduce the overall inductance between the die terminals 121 and the package terminals 130, the length of the conductive member 140 may be increased and the length of the conductive coupler 150 may be decreased. Conversely, where the circuit design is relatively independent of inductance, the conductive couplers 150 may be as long as possible and the conductive members 140 may be as short as possible to reduce overall capacitance. In one aspect of this embodiment, the conductive members may be long enough to adequately support the die 120 as the die package 110d is manufactured.

In still a further alternate embodiment, the conductive couplers 150 and conductive members 140 may be configured so that the impedance measured at each package terminal 130 is approximately equal even though the impedance measured at each die terminal 121 may be different. Accordingly, a die terminal 121a having a relatively low impedance may be coupled via a relatively high impedance path to the corresponding package terminal 130a. The high impedance path may include a short conductive coupler 150a having a relatively low impedance coupled to a relatively long conductive member 140c having a relatively high impedance. A die terminal 121c having a relatively high impedance may be coupled via a relatively low impedance path to its corresponding package terminal 130c. The low impedance path may include a long conductive coupler 150c coupled to a short conductive member 140c. The respective impedances of the conductive members 140 and conductive couplers 150 may be selected based on the size and/or material composition of the conductive members and couplers, as discussed above.

In yet a further alternate embodiment, the capacitances rather than the inductances measured at different package terminals 130 may be adjusted to be approximately equal by adjusting the size and/or shape of the conductive members 140 and conductive couplers 150 which extend between the package terminals 130 and the corresponding die terminals 121.

One advantage of matching the impedance and/or capacitance of the package terminals 130, as discussed above, is that the die 120 may have improved operational characteristics as a result. By equating or approximately equating the impedance and/or capacitance measured at each package terminal 130, signals propagated to and from the die 120 may tend to arrive and depart in a more synchronous fashion, increasing the likelihood that the signals will be properly synchronized with each other and with other signals generated by other devices to which the die may be connected.

Figure 9:
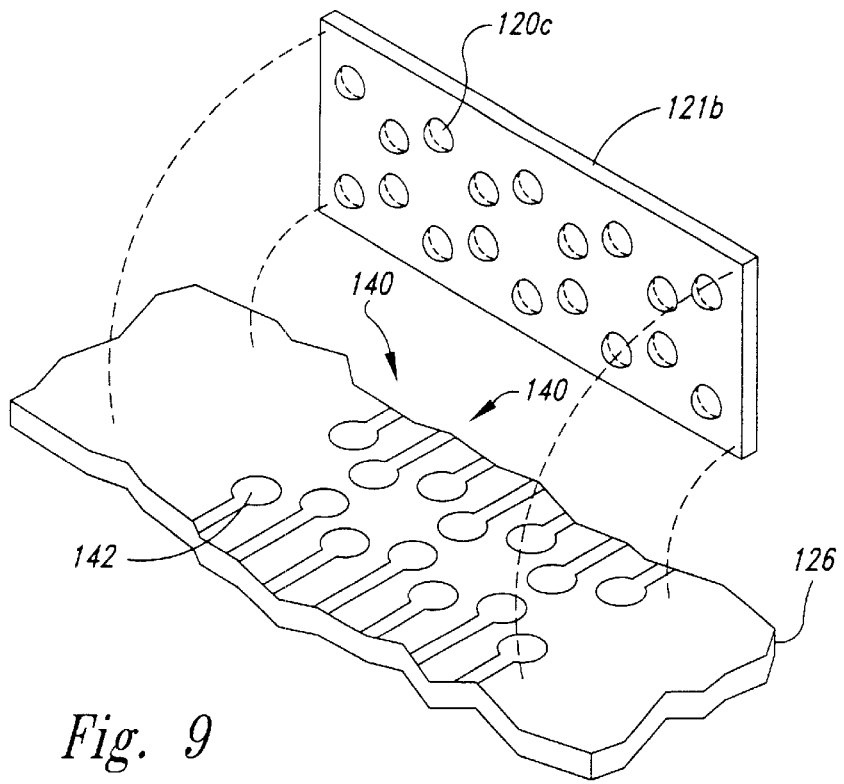
FIG. 9 is an isometric view of the top surface of a portion of a substrate having staggered conductive members thereon and a bottom isometric view of a die having correspondingly positioned solder balls.

FIG. 9 is an isometric view of the top surface of a substrate 126 having staggered conductive members 140 thereon. In one embodiment, the substrate 126 may comprise a printed circuit board and may comprise another semiconductor substrate in other embodiments. A semiconductor die 120c having die terminals 121b aligned with the conductive members 140 is shown positioned above the substrate 126 in FIG. 9. In one embodiment, the die terminals 121b comprise solder balls which may be engaged with the bonding portions 142 of the corresponding conductive members 140. The terminal portions of the conductive members 140, not shown for purposes of clarity, may be coupled to other semiconductor dies or other components. In other embodiments, the die terminals 121b may comprise other materials which may be heated so as to bond them to the corresponding conductive couplers 140. In still further embodiments, the die terminals 121b may comprise other materials which may be adhesively or otherwise bonded to the corresponding conductive members 140.

As shown in FIG. 9, the conductive members 140 are staggered in a manner similar to that discussed previously with reference to FIGS. 3–8. Accordingly, an advantage of the conductive members 140 shown in FIG. 9 is that a greater number of die terminals 121b may be positioned within a given surface area of the die 120c.

Figure 10:
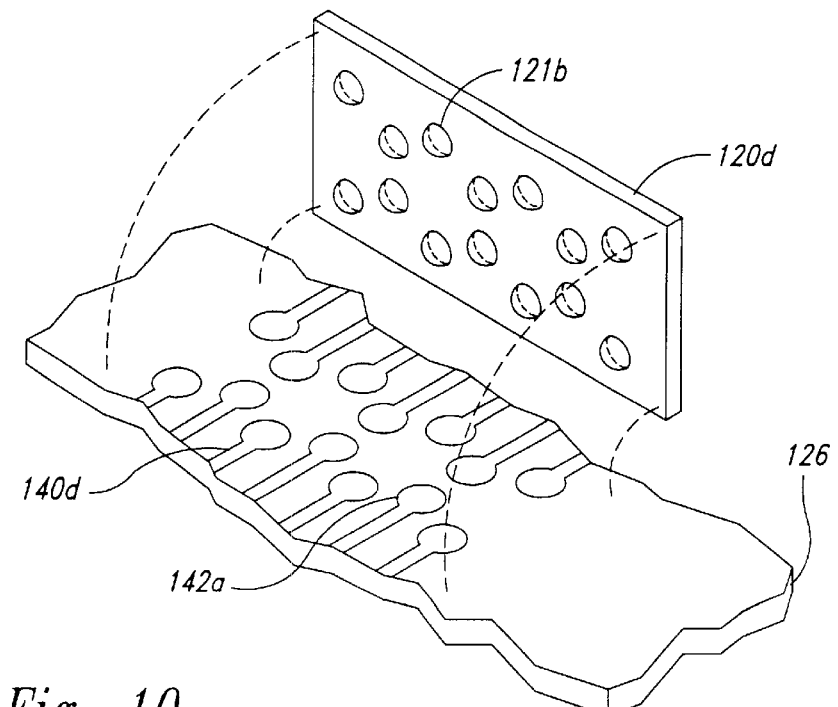
FIG. 10 is an isometric view of the top surface of a portion of a substrate having enlarged staggered conductive members thereon and a bottom isometric view of a die having correspondingly positional solder balls.

FIG. 10 is an isometric view of the top surface of a portion of a substrate 126, such as a printed circuit board, having enlarged staggered conductive members 140d positioned thereon. As discussed above with reference to FIG. 9, a semiconductor die 120d having die terminals 121b may be aligned with the substrate 126 such that the die terminals 121b engage the bonding portions 142a of the corresponding conductive members 140d when the die 120d is placed face down on the substrate. As shown in FIG. 10, the bonding portions 142a of the conductive members 140d are enlarged compared with the bonding portions 142 of the conductive members 140 shown in FIG. 9. Accordingly, the enlarged bonding portions 142a shown in FIG. 10 may provide a greater bonding area and accordingly a greater bond strength between the conductive members 140 and the corresponding die terminals 121b. Another advantage of the enlarged bonding portions 142a is that they may still align with the corresponding die terminal 121b even if the die 120d itself is slightly misaligned relative to the substrate 126. Accordingly, the enlarged bonding portions 142 provide a margin for error in the alignment process. As shown in FIG. 10, the staggered arrangement of the conductive members 140d allows enlarged bonding portions 142 to be positioned in the same area which would otherwise be occupied by conventionally sized bonding portions.

Figure 11:
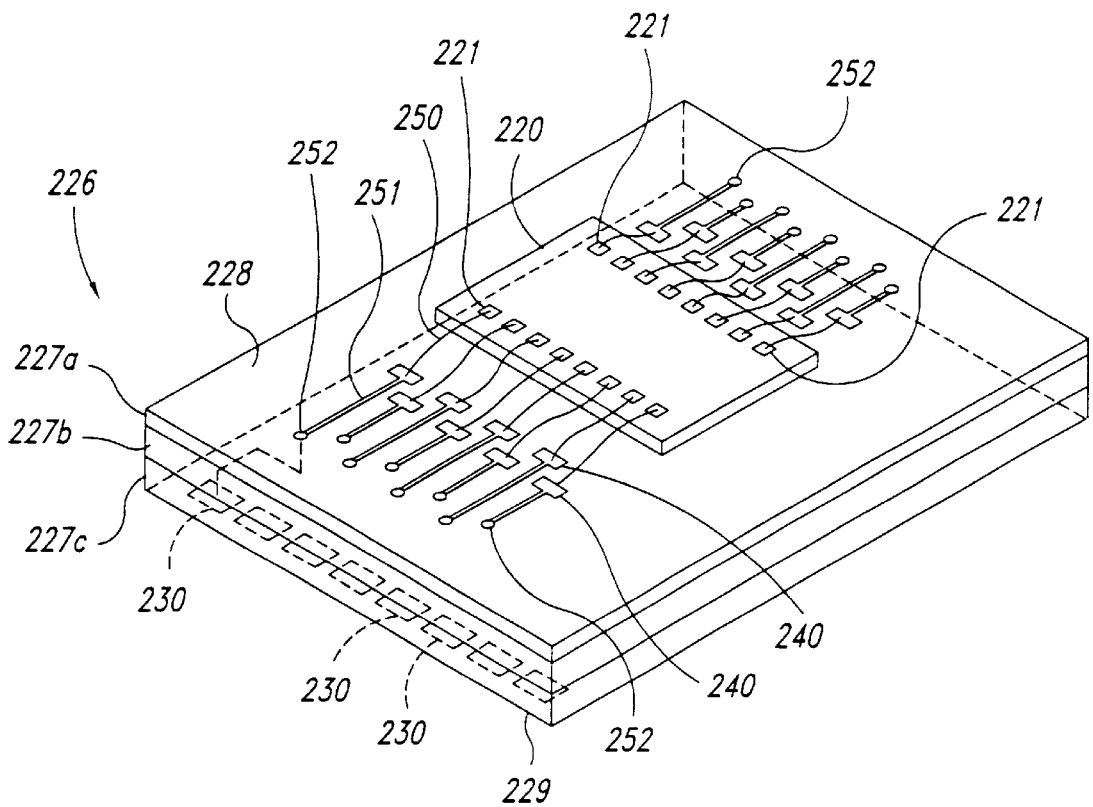
FIG. 11 is a top isometric view of a die mounted to a substrate having staggered conductive members in accordance with another embodiment of the invention.

FIG. 11 is a top isometric view of a semiconductor die 220 attached to a substrate 226 having staggered conductive members 240 in accordance with another embodiment of the invention. The substrate 226 may include a printed circuit board having several layers 227 (shown as 227a, 227b, and 227c) formed from organic epoxy-glass resin based materials, such as bis-maleimidie-triazine, or from a polyimide, a ceramic material, or another suitable material. The uppermost layer 227a may include an attachment surface 228 to which the semiconductor die 220 is attached, and the lowermost layer 227c may include a contact surface 229 opposite the attachment surface 228. A plurality of vias 252 may extend from the attachment surface 228 through the layers 227 to corresponding contacts 230 on the contact surface 229. For purposes of clarity, only one connection between a via 252 and a contact 230 is shown in FIG. 11. In one embodiment, the contacts 230 may be flush-mounted on the contact surface 229, and in other embodiments, the contacts 230 may include solder balls, such as are shown in FIG. 10, or other types of connectors. The contacts 230 may be coupled to other devices (not shown) to link the substrate 226 and the semiconductor die 220 to the other devices.

The conductive members 240 may be positioned on the attachment surface 228 proximate to the semiconductor die 220. The conductive members 240 may be coupled to the vias 252 with traces 251, and may be coupled to corresponding die terminals 221 on the semiconductor die 220 with conductive couplers 250 to transmit signals between the semiconductor die and the contacts 230. The conductive couplers 250 may comprise gold wire or other suitable conductive materials, as discussed above with reference to FIG. 3. As discussed above with respect to FIG. 8, the capacitance of the conductive couplers 250, the traces 251, and the conductive members 240 may be selected to produce a desired impedance and/or capacitance at the die terminals 221.

As shown in FIG. 11, adjacent conductive members 240 may be staggered or offset relative to one another and relative an edge 222 of the semiconductor die 220. The conductive members 240 may have a generally square shape in the embodiment shown in FIG. 11, and may have other shapes in other embodiments. In one embodiment, the conductive members 240 may be etched into the attachment surface 228, and in other embodiments the conductive members may be bonded to the attachment surface. In any of the foregoing embodiments, an advantage of the substrate 226 and the conductive members 240 shown in FIG. 11 is that an increased number of conductive members 240 may be positioned adjacent the semiconductor die 220, permitting an increased number of connections between the semiconductor die and the substrate 226.

Figure 12:
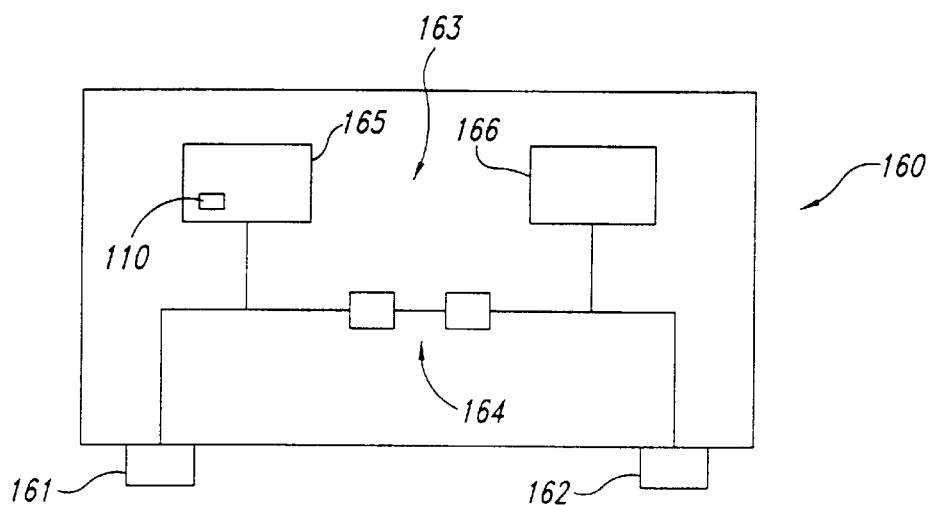
FIG. 12 is a schematic of a computer having a die package in accordance with still another embodiment of the invention.

FIG. 12 is a schematic of a computer 160 having a data input device 161 and a data output device 162. The data input and output devices 161 and 162 are coupled to circuitry 163 within the computer 160 that may include, but is not limited to, a processor 165, a memory 166 and a chipset 164. In one embodiment, the processor 165 includes a die package 110 that is generally similar to the die package shown in FIG. 3. In other embodiments, the chipset 164 and/or the memory 166 and/or other circuitry components (not shown) may include a die package 110. In still further embodiments, the circuitry 163 may include die packages generally similar to any of the die packages shown in FIGS. 4–11.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A microelectronic device, comprising:

a semiconductor die having first and second terminals;

a first elongated conductive member extending between a first end portion and a second end portion thereof, the second end portion being at least proximate the first terminal of the die, the conductive member further having an intermediate portion between the first and second end portions, a width of the intermediate portion being less than a width of the second end portion; and a second conductive member elongated between a first end portion and a second end portion thereof, the second conductive member being generally parallel to the first conductive member, the second end portion of the second conductive member being proximate to the second terminal of the die and being offset along a longitudinal axis from the second end portion of the first conductive member.

2. The device of claim 1 wherein at least the second end portion of at least one of the first or second conductive members engages a surface of the semiconductor die.

3. The device of claim 1 wherein at least one of the first or second conductive members is affixed to the die.

4. The device of claim 1 wherein at least one of the first and second terminals of the die comprises a solder ball, the solder ball being engaged with the second end portion of at least one of the first or second conductive members.

5. The device of claim 1 wherein the second end portion of at least one of the first or second conductive members is proximate an edge of the semiconductor die.

6. The device of claim 1, further comprising a conductive coupler having a first end coupled to at least one of the first and second terminals and a second end coupled to the second end portion of at least one of the first or second conductive members to electrically couple at least one of the first and second terminals to at least one of the first or second conductive members.

7. The device of claim 6 wherein the size and shape of at least one of the first or second conductive members are selected to produce a first capacitance and the size and shape of the conductive coupler are selected to produce a second capacitance, at least one of the first or second conductive members and the conductive coupler together producing a selected third capacitance.

8. The device of claim 6 wherein at least one of the first or second conductive members is selected to have a first inductance and the conductive coupler is selected to have a second inductance, at least one of the first or second conductive members and the conductive coupler together producing a selected third inductance at the first end portion of at least one of the first or second conductive members.

9. The device of claim 6 wherein the conductive coupler comprises at least one of a gold wire, an aluminum wire and a conductive adhesive.

10. The device of claim 1 wherein at least one of the first or second conductive members comprises at least one of a copper alloy and a nickel/iron alloy.

11. A microelectronic device, comprising:
a support;
a semiconductor die having first and second terminals, the semiconductor die engaging the support;
a first elongated conductive member having a first end portion and a second end portion opposite the first end portion, the second end portion being proximate the first terminal of the die, the second conductive member having an intermediate portion between the first and second end portions, a width of the intermediate portion being less than a width of the second end portion; and
a second conductive member elongated between a first end portion and a second end portion thereof, the second conductive member being generally parallel to the first conductive member, the second end portion of the second conductive member being proximate to the second terminal of the die and being offset along a longitudinal axis from the second end portion of the first conductive member.

12. The device of claim 11, further comprising a conductive coupler having a first end coupled to at least one of the first and second terminals and a second end coupled to the second end portion of at least one of the first or second conductive members to electrically couple at least one of the first and second terminals to at least one of the first or second conductive members.

13. The device of claim 12 wherein the conductive coupler comprises a gold wire.

14. The device of claim 12 wherein at least one of the first or second conductive members is sized and shaped to produce a first capacitance and the conductive coupler is sized and shaped to produce a second capacitance, at least one of the first or second conductive members and the conductive coupler together producing a selected third capacitance.

15. The device of claim 12 wherein at least one of the first or second conductive members is selected to have a first inductance and the conductive coupler is selected to have a second inductance, at least one of the first or second conductive members and the conductive coupler together producing a selected third inductance at the first end portion of at least one of the first or second conductive members.

16. The device of claim 11 wherein at least one of the first or second conductive members comprises at least one of a copper alloy and a nickel/iron alloy.

17. The device of claim 11, further comprising an encapsulating material attached to the support and surrounding the die, the encapsulating material forming a package which houses the die therein.

18. A microelectronic device, comprising:
a semiconductor die having first and second terminals;
a first conductive member extending between a first end portion and a second end portion thereof, the second end portion being in contact with a surface of the semiconductor die proximate the first terminal, the conductive member having an intermediate portion between the first and second end portions, a width of the intermediate portion being less than a width of the second end portion; and
a second conductive member elongated between a first end portion and a second end portion thereof and further having an intermediate portion between the first and second end portions, a width of the intermediate portion being less than a width of the second end portion, the second conductive member being generally parallel to the first conductive member, the second end portion of the second conductive member being in contact with a surface of the semiconductor proximate to the second terminal of the die and being offset along a longitudinal axis from the second end portion of the first conductive member so that the second end portion of at least one of the first and second conductive members is adjacent to the intermediate portion of the other of the first and second conductive members.

19. The device of claim 18, further comprising a conductive coupler having a first end coupled to at least one of the first and second terminals and a second end coupled to the second end portion of at least one of the first or second conductive members to electrically couple at least one of the first and second terminals to at least one of the first or second conductive members.

20. The device of claim 19 wherein the conductive coupler comprises a gold wire.

21. The device of claim 19 wherein at least one of the first or second conductive members is selected to produce a first capacitance and the conductive coupler is selected to produce a second capacitance, at least one of the first or second conductive members and the conductive coupler together producing a selected third capacitance.

22. The device of claim 19 wherein at least one of the first or second conductive members is selected to have a first inductance and the conductive coupler is selected to have a second inductance, at least one of the first or second conductive members and the conductive coupler together producing a selected third inductance at the first end portion of at least one of the first or second conductive members.

23. The device of claim 18 wherein at least one of the first or second conductive members comprises at least one of a copper alloy and a nickel/iron alloy.

24. A microelectronic device, comprising:
a semiconductor die having first and second terminals terminal and
a conductive member elongated between a first end portion and a second end portion thereof, the second end portion being in contact with the first terminal, the conductive member having an intermediate portion between the first and second end portions, a width of the intermediate portion being less than a width of the second end portion;
a second conductive member elongated between a first end portion and a second end portion thereof, the second end portion of the second conductive member being proximate to the second terminal of the die and being offset along a longitudinal axis from the second end portion of the first conductive member so that the end portion of the second conductive member is adjacent to the intermediate portion of the first conductive member.

25. The device of claim 24 wherein the at least one terminal is positioned on a lower surface of the semiconductor die.

26. The device of claim 24 wherein the at least one terminal comprises a solder ball bonded to the second end portion of at least one of the first or second conductive members.

27. The device of claim 24 wherein at least one of the first or second conductive members comprises at least one of a copper alloy and a nickel/iron alloy.

28. The device of claim 24 wherein at least one of the first or second conductive members is sized and shaped to produce a first capacitance and the conductive coupler is sized and shaped to produce a second capacitance, at least one of the first or second conductive members and the conductive coupler together producing a selected third capacitance.

29. The device of claim 24 wherein at least one of the first or second conductive members is selected to have a first inductance and the conductive coupler is selected to have a second inductance, at least one of the first or second conductive members and the conductive coupler together producing a selected third inductance at the first end portion of at least one of the first or second conductive members.

30. A microelectronic device, comprising:
a die having first and second terminals;
a first conductive member elongated between a first end portion and a second end portion thereof, the second end portion being proximate to the first terminal of the die; and
a second conductive member elongated between a first end portion and a second end portion thereof, the second conductive member being generally parallel to the first conductive member, the second end portion of the second conductive member being proximate to the second terminal of the die, the second end portion of the second conductive member being offset along the second longitudinal axis from the second end portion of the first conductive member.

31. The device of claim 30 wherein a width of the intermediate portion of the first conductive member is less than a width of the second end portion of the first conductive member.

32. The device of claim 30 wherein the second end portion of at least one of the first and second conductive members is in contact with a surface of the die.

33. The device of claim 30 wherein the second end portion of at least one of the first and second conductive members is spaced apart from the die.

34. A microelectronic device, comprising:
a die having first and second terminals;
a first conductive member elongated between a first end portion and a second end portion thereof, the second end portion being proximate to the first terminal of the die, the first conductive member further having a first intermediate portion between the first and second end portions thereof, a width of the first intermediate portion being less than a width of the second end portion;
a first conductive coupler coupled to and extending between the first terminal of the die and the second end portion of the first conductive member;
a second conductive member elongated between first and second end portions thereof, the second end portion of the second conductive member being proximate to the second terminal of the die, the second conductive member further having a second intermediate portion between the first and second end portions thereof, a width of the second intermediate portion being less than a width of the second end portion of the second conductive member, the second end portion of the second conductive member being axially offset relative to the second end portion of the first conductive member; and
a second conductive coupler coupled to and extending between the second terminal of the die and the second end portion of the second conductive member.

35. The device of claim 34 wherein the second end portion of at least one of the first and second conductive members engages a surface of the die.

36. The device of claim 34 wherein the second end portion of at least one of the first and second conductive members is spaced apart from the die.

37. A microelectronic device, comprising:
a package having first and second package terminals;
a semiconductor die positioned within the package and having first and second die terminals;
a first conductive member having first and second opposite ends and an intermediate portion between the first and second ends, the intermediate portion having a width smaller than a width of the second end and the first conductive member being coupled at the first end to the first package terminal;
a first conductive coupler having first and second opposite ends and coupled at the first end thereof to the first die terminal and coupled at the second end thereof to the second end of the first conductive member;
a second conductive member having first and second opposite ends and coupled at the first end thereof to the second package terminal, the second end being adjacent to the intermediate portion of the first conductive member; and
a second conductive coupler having first and second opposite ends and coupled at the first end thereof to the second die terminal and coupled at the second end thereof to the second end of the second conductive member, the first conductive member and first conductive coupler being selected to produce a first impedance at the first package terminal and the second conductive member and second conductive coupler being selected to produce a second impedance at the second package terminal, the first impedance being approximately equal to the second impedance.

38. The device of claim 37 wherein the first and second conductive couplers comprise gold wire.

39. The device of claim 37 wherein the first and second conductive members comprise at least one of a copper alloy and a nickel/iron alloy.

40. A microelectronic device, comprising:
a package having first and second package terminals;
a semiconductor die positioned within the package and having first and second die terminals;
a first conductive member having first and second opposite ends and an intermediate portion between the first and second ends, the intermediate portion having a width smaller than a width of the second end and the first conductive member being coupled at the first end to the first package terminal;
a first conductive coupler having first and second opposite ends and coupled at the first end thereof to the first die terminal and coupled at the second end thereof to the second end of the first conductive member;
a second conductive member having first and second opposite ends and coupled at the first end thereof to the second package terminal, the second end being adjacent to the intermediate portion of the first conductive member; and
a second conductive coupler having first and second opposite ends and coupled at the first end thereof to the second die terminal and coupled at the second end thereof to the second end of the second conductive member, the first conductive member and first conductive coupler being selected to produce a first capacitance and the second conductive member and second conductive coupler being selected to produce a second capacitance, the first capacitance being approximately equal to the second capacitance.

41. The device of claim 40 wherein the first capacitance is measured between the first die terminal and ground and the second capacitance is measured between the second die terminal and ground.

42. The device of claim 40 wherein the package has a third package terminal and the semiconductor die has a third die terminal, further comprising a third conductive member coupled to the third package terminal and a third conductive coupler coupled between the third conductive member and the third die terminal, the first capacitance being measured between the first and third die terminals, the second capacitance being measured between the second and third die terminals.

43. The device of claim 40 wherein the first and second conductive couplers comprise wire having a generally circular cross-sectional shape.

44. The device of claim 40 wherein the first and second conductive members have a generally planar shape.

45. A microelectronic device, comprising:
a substrate having a first conductive member and a second conductive member spaced apart from the first conductive member, at least one of the first and second conductive members having a generally rectangular portion proximate a die;
the die having first and second terminals and an edge, the die being attached to the substrate such that a distance between the first conductive member and the edge is different than a distance between the second conductive member and the edge.

46. The device of claim 45, further comprising:
a first conductive coupler coupled to and extending between the first conductive member and the first terminal of the die; and
a second conductive coupler coupled to and extending between the second conductive member and the second terminal of the die.

47. The device of claim 46 wherein the first conductive coupler is selected to produce a first capacitance and the second conductive coupler is selected to produce a second capacitance, the first capacitance being approximately equal to the second capacitance.

48. The device of claim 47 wherein the first capacitance is measured between the first terminal of the die and ground and the second capacitance is measured between the second terminal of the die and ground.

49. The device of claim 45 wherein the substrate includes a printed circuit board.

50. The device of claim 49 wherein the printed circuit board comprises a plurality of layers and the die is attached to one of the plurality of layers.

51. The device of claim 45, wherein the substrate has a first surface and a second surface opposite the first surface and the die is attached to the first surface of the substrate, further comprising:
a first conductive via proximate to the first surface, tending beneath the first surface and coupled to the first conductive member; and
a second conductive via proximate the first suffice, extending beneath the first surface and coupled to the second conductive member.

52. The device of claim 51 wherein the second surface has a first contact coupled to the first via and a second contact coupled to the second via.

53. The device of claim 52 wherein at least one of the first and second contacts is a solder ball.

54. The device of claim 52 wherein at least one of the first and second contacts is generally flush with the contact surface.

55. A computer system, comprising:
a data input device;
a data output device; and
computing circuitry coupled to the data input and output devices, the computing circuitry including
a semiconductor die having first and second terminals;
a conductive member elongated between a first end portion and a second end portion thereof, the second end portion being proximate the first terminal of the die, the conductive member having an intermediate portion between the first and second end portions, a width of the intermediate portion being less than a width of the second end portion; and
a second conductive member elongated between a first end portion and a second end portion thereof, the second conductive member being generally parallel to the first conductive member, the second end portion of the second conductive member being in contact with a surface of the semiconductor proximate to the second terminal of the die, the second end portion of the second conductive member being offset along a longitudinal axis from the second end portion of the first conductive member.

56. The computer system of claim 55 wherein the computing circuitry further includes a conductive coupler coupled to and extending between at least one of the first and second terminals of the die and the second end portion of at least one of the first or second conductive members.

57. The computer system of claim 56 wherein at least one of the first or second conductive members is selected to have a first impedance and the conductive coupler is selected to have a second impedance, at least one of the first or second conductive members and conductive coupler together producing a selected third impedance at the first end portion of at least one of the first or second conductive members.

58. The computer system of claim 55 wherein at least one of the first and second terminals is a first terminal, at least one of the first or second conductive members is a first conductive member, and the circuitry further includes a second terminal positioned adjacent the first terminal and a second conductive member elongated between a first end portion and a second end portion thereof, the second end portion of the second conductive member being proximate to and coupleable to the second terminal, the second end portion of the second conductive member being offset relative to the second end portion of the first conductive member.

59. The computer system of claim 58 wherein the second conductive member has an intermediate portion between the first and second end portions thereof, a width of the intermediate portion of the second conductive member being less than a width of the second end portion of the second conductive member.

60. The computer system of claim 58 wherein the computing circuitry further includes a first coupling member extending between the first terminal and the second end portion of the first conductive member and a second coupling member extending between the second terminal and the second end portion of the second conductive member, the first coupling member and first conductive member being selected to produce a first impedance at the first end portion of the first conductive member, the second coupling member and second conductive member being selected to produce a second impedance and the first end portion of the second conductive member approximately equal to the first impedance.

61. A microelectronic device, comprising:
a substrate having a first conductive member and a second conductive member spaced apart from the first conductive member;
a die having first and second terminals and an edge, the die being attached to the substrate such that a distance between the first conductive member and the edge is different than a distance between the second conductive member and the edge;
a first conductive coupler coupled to and extending between the first conductive member and the first terminal of the die; and
a second conductive coupler coupled to and extending between the second conductive member and the second terminal of the die.

62. The device of claim 61 wherein the first conductive coupler is selected to produce a first capacitance and the second conductive coupler is selected to produce a second capacitance, the first capacitance being approximately equal to the second capacitance.

63. The device of claim 62 wherein the first capacitance is measured between the first terminal of the die and ground and the second capacitance is measured between the second terminal of the die and ground.

64. The device of claim 62 wherein the substrate includes a printed circuit board.

65. The device of claim 64 wherein the printed circuit board comprises a plurality of layers and the die is attached to one of the plurality of layers.

66. The device of claim 61, wherein the substrate has a first surface and a second surface opposite the first surface and the die is attached to the first surface of the substrate, further comprising:
a first conductive via proximate to the first surface, extending beneath the first surface and coupled to the first conductive member; and
a second conductive via proximate the first surface, extending beneath the first surface and coupled to the second conductive member.

67. The device of claim 66 wherein the second surface has a first contact coupled to the first via and a second contact coupled to the second via.

68. The device of claim 67 wherein at least one of the first and second contacts is a solder ball.

69. The device of claim 67 wherein at least one of the first and second contacts is generally flush with the contact surface.

70. The device of claim 61 wherein at least one of the first and second conductive members is etched on a surface of the substrate.

71. A microelectronic device, comprising:
a substrate having a first conductive member and a second conductive member spaced apart from the first conductive member;
a die having first and second terminals and an edge, the die being attached to the substrate, the substrate having a first surface and a second surface opposite the first surface and the die being attached to the first surface of the substrate such that a distance between the first conductive member and the edge is different than a distance between the second conductive member and the edge;
a first conductive via proximate to the first surface, extending beneath the first surface and coupled to the first conductive member; and
a second conductive via proximate the first surface, extending beneath the first surface and coupled to the second conductive member.

72. The device of claim 71 wherein the second surface has a first contact coupled to the first via and a second contact coupled to the second via.

73. The device of claim 72 wherein at least one of the first and second contacts is a solder ball.

74. The device of claim 72 wherein at least one of the first and second contacts is generally flush with the contact surface.

75. The device of claim 71 wherein at least one of the first and second conductive members is etched on a surface of the substrate.

76. A microelectronic device, comprising:
a substrate having a first conductive member and a second conductive member spaced apart from the first conductive member, at least one of the first and second conductive members being etched on a surface of the substrate;
a die having first and second terminals and an edge, the die being attached to the substrate such that a distance between the first conductive member and the edge is different than a distance between the second conductive member and the edge.

* * * * *

UNITED STATES PATENT AND TRADEMARK OFFICE
CERTIFICATE OF CORRECTION

PATENT NO. : 6,600,215 B1
DATED : July 29, 2003
INVENTOR(S) : Aaron Schoenfeld et al.

It is certified that error appears in the above-identified patent and that said Letters Patent is hereby corrected as shown below:

Column 3,
Line 51, "positional solder balls." should read -- positioned solder balls. --

Column 5,
Line 50, "leafage." should read -- leadfinger. --

Column 13,
Lines 16-17, "first and second terminals terminal and" should read -- first and second terminals; and --

Column 16,
Line 32, "the first suffice," should read -- the first surface, --

Signed and Sealed this

Twenty-ninth Day of June, 2004

JON W. DUDAS
*Acting Director of the United States Patent and Trademark Office*